US012591183B2

(12) United States Patent
Van De Wijdeven et al.

(10) Patent No.: US 12,591,183 B2
(45) Date of Patent: Mar. 31, 2026

(54) SENSOR POSITIONING METHOD, A POSITIONING SYSTEM, A LITHOGRAPHIC APPARATUS, A METROLOGY APPARATUS, AND A DEVICE MANUFACTURING METHOD

(71) Applicant: ASML Netherlands B.V., Veldhoven (NL)

(72) Inventors: Jeroen Johan Maarten Van De Wijdeven, Eindhoven (NL); Michaël Johannes Christiaan Ronde, Berghem (NL); Bram Antonius Gerardus Lomans, Eindhoven (NL); Bastiaan Lambertus Wilhelmus Marinus Van De Ven, Rosmalen (NL)

(73) Assignee: ASML Netherlands B.V., Veldhoven (NL)

( * ) Notice: Subject to any disclaimer, the term of this patent is extended or adjusted under 35 U.S.C. 154(b) by 176 days.

(21) Appl. No.: 18/682,038

(22) PCT Filed: Jul. 12, 2022

(86) PCT No.: PCT/EP2022/069373
§ 371 (c)(1),
(2) Date: Feb. 7, 2024

(87) PCT Pub. No.: WO2023/016732
PCT Pub. Date: Feb. 16, 2023

(65) Prior Publication Data
US 2025/0004390 A1 Jan. 2, 2025

(30) Foreign Application Priority Data
Aug. 9, 2021 (EP) .................................... 21190404

(51) Int. Cl.
*G03F 9/00* (2006.01)
*G03F 7/00* (2006.01)

(52) U.S. Cl.
CPC ........ *G03F 9/7046* (2013.01); *G03F 7/70775* (2013.01); *G03F 9/7088* (2013.01)

(58) Field of Classification Search
CPC .. G03F 7/70775; G03F 7/7085; G03F 9/7046; G03F 9/7088
See application file for complete search history.

(56) References Cited

U.S. PATENT DOCUMENTS 6,020,964 A    2/2000  Loopstra et al.
6,373,072 B1   4/2002  Butler et al.
(Continued)

FOREIGN PATENT DOCUMENTS

EP    2 003 681 A1    12/2008
EP    4 020 086 A1     6/2022
(Continued)

OTHER PUBLICATIONS

International Search Report and Written Opinion of the International Searching Authority directed to International Patent Application No. PCT/EP2022/069373, mailed Aug. 9, 2022; 9 pages.

*Primary Examiner* — Peter B Kim
(74) *Attorney, Agent, or Firm* — Finnegan, Henderson, Farabow, Garrett & Dunner LLP

(57) ABSTRACT

The invention provides a method for positioning a sensor over a target on a moveable object, comprising the following steps: a. moving the object to move the target to a desired position, b. moving the sensor in a direction towards a measured momentary position of the target, c. when the sensor is over the target. moving the sensor along with the target to the desired position of the target.

18 Claims, 7 Drawing Sheets

(56)        References Cited

U.S. PATENT DOCUMENTS

| | | | |
|---|---|---|---|
| 6,881,954 B1 * | 4/2005 | Morimoto | B82Y 35/00 |
| | | | 250/311 |
| 6,952,253 B2 | 10/2005 | Lof et al. | |
| 7,847,919 B2 | 12/2010 | Butler | |
| 9,229,339 B2 | 1/2016 | Butler et al. | |
| 9,671,702 B2 | 6/2017 | Butler et al. | |
| 10,175,587 B2 | 1/2019 | Butler et al. | |
| 10,248,027 B2 | 4/2019 | Butler et al. | |
| 2004/0227925 A1 * | 11/2004 | Sato | G03B 27/58 |
| | | | 355/75 |
| 2007/0058173 A1 | 3/2007 | Holzapfel | |
| 2019/0228518 A1 | 7/2019 | Manassen et al. | |
| 2021/0096061 A1 | 4/2021 | Hill et al. | |

FOREIGN PATENT DOCUMENTS

| | | | |
|---|---|---|---|
| WO | WO 2017/063898 A1 | 4/2017 | |
| WO | WO 2017/064354 A1 | 4/2017 | |

* cited by examiner

SENSOR POSITIONING METHOD, A POSITIONING SYSTEM, A LITHOGRAPHIC APPARATUS, A METROLOGY APPARATUS, AND A DEVICE MANUFACTURING METHOD

CROSS-REFERENCE TO RELATED APPLICATIONS

This application claims priority of EP application Ser. No. 21/190,404.0 which was filed on Aug. 9, 2021 and which is incorporated herein in its entirety by reference.

FIELD

The present invention relates to a sensor positioning method for positioning a sensor over a target and a corresponding positioning system. The present invention also relates to a lithographic apparatus comprising such a positioning system and a metrology apparatus comprising such a positioning system. The present invention further relates to a method for manufacturing a device using a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

Typically, the integrated circuits as manufactured include a plurality of layers containing different patterns, each layer being generated using an exposure process. In order to ensure proper operation of the integrated circuit that is manufactured, the layers as consecutively exposed need to be properly aligned to each other. In order to realize this, substrates are typically provided with a plurality of so-called alignment marks (also referred to as alignment targets), whereby a position of the alignment mark is used to determine or estimate a position of a previously exposed pattern, said position also being referred to as the target portion as it is the target position for a subsequent pattern that is to be exposed in line or aligned with the previously exposed pattern. As such, prior to the exposure of a subsequent layer, the position of alignment marks is determined and used to determine a position of the pattern that was previously exposed.

Typically, in order to determine the positions of such alignment marks, an alignment sensor is applied which may e.g. be configured to project a radiation beam onto an alignment mark or target and determine, based on a reflected radiation beam, a position of the alignment mark. Deviations may exist between an actual mark position and a measured mark position resulting in a subsequent layer being projected or exposed on a position which is not in line, i.e. not aligned, with the previously exposed pattern, resulting in a so-called overlay error. In a lithographic processing environment, substrates that have been exposed may e.g. be examined in a metrology apparatus or system that is configured to measure an overlay or overlay distribution on a substrate. When such overlay or overlay distribution is known, it may e.g. be applied as a feedback to the exposure process in order to improve the accuracy of the exposure process. In order to determine the overlay, use is made of overlay marks (or overlay targets) which may be distributed over a substrate.

Measuring the position of the alignment marks as well as the position of the overlay marks on the substrate involves the positioning of a sensor, e.g. the alignment sensor or an overlay sensor, over a target, e.g. the alignment mark or overlay mark, that is on a moveable object, e.g. a substrate or substrate table. Positioning of the sensor may be done repeatably in case of a plurality of targets per moveable object to be measured.

In the prior art, when the sensor is positioned over the target, by moving the target, there may be some settling time after moving the sensor before the sensor is able to perform a measurement. Additionally, or alternatively, the sensor may need time to get the target in an acceptable focus range. Both the settling time and the focus time have an adverse effect on the total measurement time and thus on throughput.

SUMMARY

Considering the above, it is an object of the invention to provide a method for positioning a sensor over a target requiring less time thereby improving the throughput.

According to an embodiment of the invention, there is provided a method for positioning a sensor over a target on a moveable object, comprising the following steps:

a. moving the object to move the target to a desired position, b. moving the sensor in a direction towards a measured momentary position of the target, c. when the sensor is over the target, moving the sensor along with the target to the desired position of the target.

According to another embodiment of the invention, there is provided a positioning system for positioning a sensor over a target on a moveable object, comprising:

an object actuation system for moving and positioning the moveable object, a sensor actuation system for moving and positioning the sensor, an object measurement system for measuring a momentary position of the moveable object, a sensor measurement system for measuring a momentary position of the sensor, and a control unit for driving the object actuation system based on an output of the object measurement system and a desired momentary position of the target on the object, and for driving the sensor actuation system based on an output of the sensor measurement system and a desired momentary position of the sensor, wherein the control unit is configured to:

a. drive the object measurement system to move the target to a desired position, b. drive the sensor actuation system to move the sensor in a direction towards the measurement momentary position of the target, c. when the sensor is over the target, drive the sensor actuation system to move the sensor along with the target to the desired position of the target.

According to further embodiment of the invention, there is provided a lithographic apparatus comprising a positioning system according to the invention.

According to yet another embodiment of the invention, there is provided a metrology apparatus comprising:

a moveable sensor, a moveable object table to hold an object with a target, and a positioning system according to the invention, wherein the object actuation system is configured to move and position the object by moving and positioning the object table.

According to yet another embodiment of the invention, there is provided a device manufacturing method wherein use is made of a lithographic apparatus according to the invention.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm), but also visible radiation e.g. used for optical sensors in the range of 400-900 nm.

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
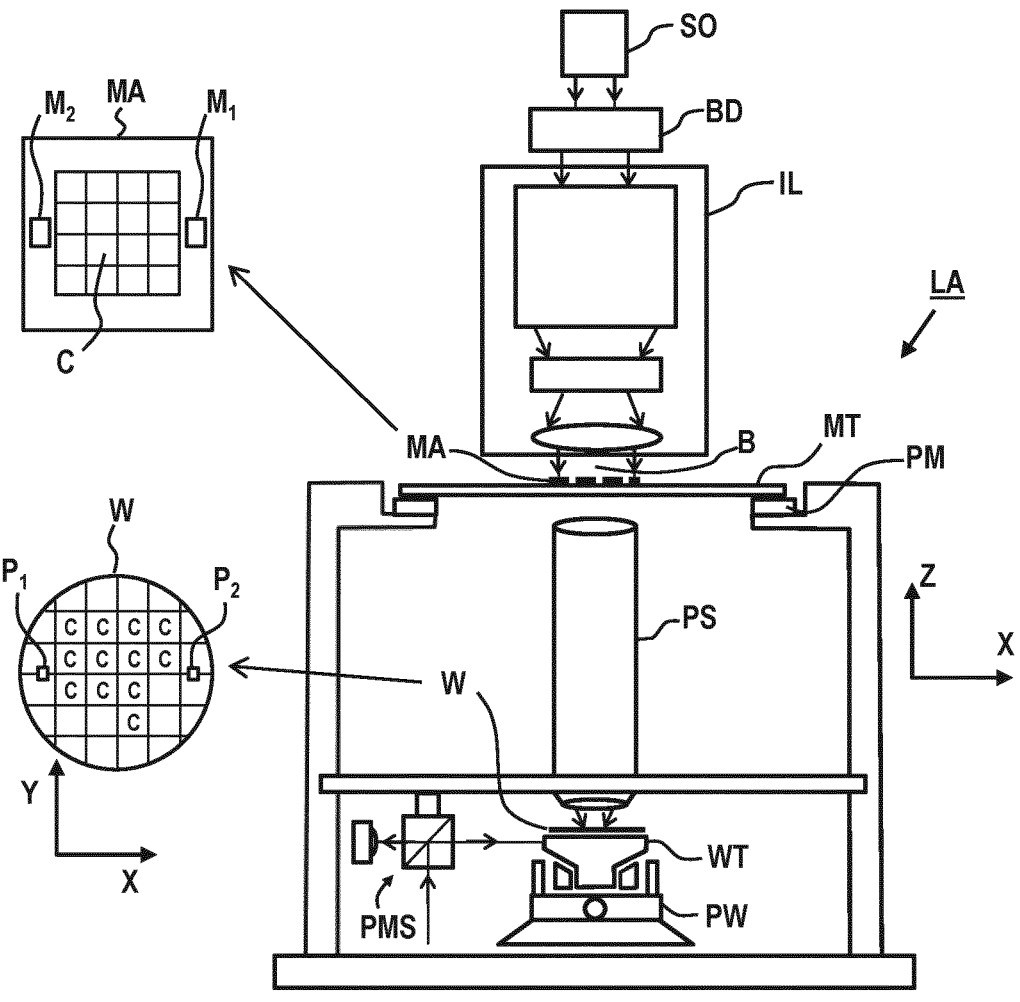
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W-which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axes, i.e., an x-axis, a y-axis and a z-axis. Each of the three axes is orthogonal to the other two axes. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
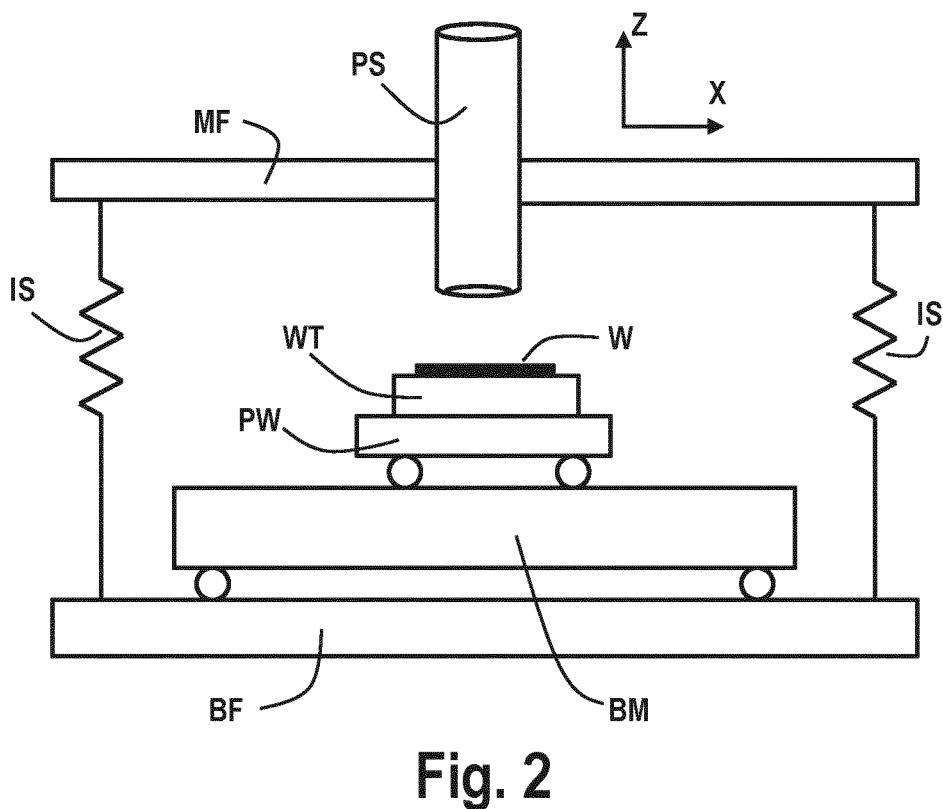
FIG. 2 depicts a detailed view of a part of the lithographic apparatus of FIG. 1.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position measurement system PMS. The metrology frame MF is supported by the base frame BF via the vibration isolation system IS. The vibration isolation system IS is arranged to prevent or reduce vibrations from propagating from the base frame BF to the metrology frame MF.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the substrate support WT.

In an embodiment, the second positioner PW is supported by the balance mass BM. For example, wherein the second positioner PW comprises a planar motor to levitate the substrate support WT above the balance mass BM. In another embodiment, the second positioner PW is supported by the base frame BF. For example, wherein the second positioner PW comprises a linear motor and wherein the second positioner PW comprises a bearing, like a gas bearing, to levitate the substrate support WT above the base frame BF.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor, a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States patent application US2007/0058173A1, filed on Sep. 7, 2006, hereby incorporated by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, $+1^{st}$ order, $-1^{st}$ order, $+2^{nd}$ order and $-2^{nd}$ order. The encoder system optically combines the primary radiation beam and the secondary radiation beam into a combined radiation beam. A sensor in the encoder head determines a phase or phase difference of the combined radiation beam. The sensor generates a signal based on the phase or phase difference. The signal is representative of a position of the encoder head relative to the grating. One of the encoder head and the grating may be arranged on the substrate structure WT. The other of the encoder head and the grating may be arranged on the metrology frame MF or the base frame BF. For example, a plurality of encoder heads is arranged on the metrology frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example, U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the substrate support WT. The reference mirror may be connected to the metrology frame MF. In an embodiment, the measurement beam and the reference beam are combined into a combined radiation beam by an additional optical component instead of the beam splitter.

The first positioner PM may comprise a long-stroke module and a short-stroke module. The short-stroke module is arranged to move the mask support MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the mask support MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the substrate support WT relative to the projection system PS with a high accuracy over a large range of movement.

The first positioner PM and the second positioner PW each are provided with an actuator to move respectively the mask support MT and the substrate support WT. The actuator may be a linear actuator to provide a driving force along a single axis, for example the y-axis. Multiple linear actuators may be applied to provide driving forces along multiple axis. The actuator may be a planar actuator to provide a driving force along multiple axis. For example, the planar actuator may be arranged to move the substrate support WT in 6 degrees of freedom. The actuator may be an electromagnetic actuator comprising at least one coil and at least one magnet. The actuator is arranged to move the at least one coil relative to the at least one magnet by applying an electrical current to the at least one coil. The actuator may be a moving-magnet type actuator, which has the at least one magnet coupled to the substrate support WT respectively to the mask support MT. The actuator may be a moving-coil type actuator which has the at least one coil coupled to the substrate support WT respectively to the mask support MT. The actuator may be a voice-coil actuator, a reluctance actuator, a Lorentz-actuator or a piezo-actuator, or any other suitable actuator.

FIG. 2 may alternatively depict a metrology apparatus according to the invention, which metrology apparatus may be part of the lithographic apparatus of FIG. 1 or may be separate therefrom. The metrology apparatus may be used to examine substrates W exposed by the lithographic apparatus as described above, e.g. to measure an overlay or overlay distribution. The substrate table WT may alternatively be referred to as object table and the substrate W may alternatively be referred to as object.

The substrate W may then be provided with overlay marks distributed over the substrate W. The projection system PS is then not used to transfer a pattern to the substrate W, but to direct radiation towards the overlay marks and for instance detect reflected and/or scattered radiation to determine a relative position of the overlay marks. To this end, the projection system PS comprises a sensor, comprising an objective lens, that can be positioned over a target such as an overlay mark. The objective lens, the sensor and/or projection system may be moveable using a positioner similar to the aforementioned first positioner PM allowing to position the sensor.

Figure 3:
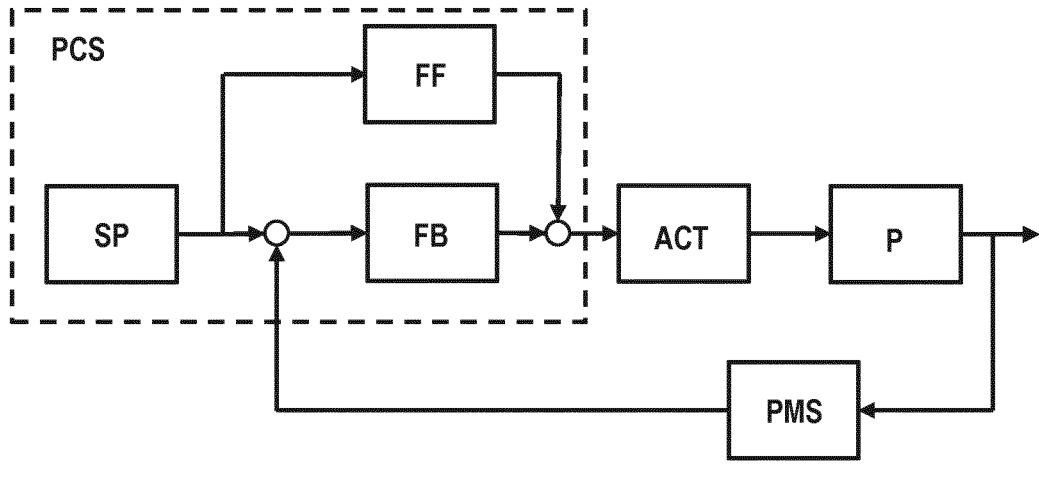
FIG. 3 schematically depicts a position control system as part of a positioning system according to an embodiment of the invention.

The lithographic apparatus LA comprises a position control system PCS as schematically depicted in FIG. 3. The position control system PCS comprises a setpoint generator SP, a feedforward controller FF and a feedback controller FB. The position control system PCS provides a drive signal to the actuator ACT. The actuator ACT may be the actuator of the first positioner PM or the second positioner PW. The actuator ACT drives the plant P, which may comprise the substrate support WT or the mask support MT. An output of the plant P is a position quantity such as position or velocity or acceleration. The position quantity is measured with the position measurement system PMS. The position measurement system PMS generates a signal, which is a position signal representative of the position quantity of the plant P. The setpoint generator SP generates a signal, which is a reference signal representative of a desired position quantity of the plant P. For example, the reference signal represents a desired trajectory of the substrate support WT. A difference between the reference signal and the position signal forms an input for the feedback controller FB. Based on the input, the feedback controller FB provides at least part of the drive signal for the actuator ACT.

The reference signal may form an input for the feedforward controller FF. Based on the input, the feedforward controller FF provides at least part of the drive signal for the actuator ACT. The feedforward FF may make use of information about dynamical characteristics of the plant P, such as mass, stiffness, resonance modes and eigenfrequencies.

FIGS. 4 to 7 schematically depict a metrology apparatus MTO according to an embodiment of the invention. The metrology apparatus MTO includes a moveable sensor SE, in this embodiment an optical sensor, allowing to measure a parameter from a target. The parameter may for instance be a position, reflectivity, etc. while the target may for instance be a grating.

The sensor SE comprises components, such as emitters, detectors and optical components, and may not necessarily be moveable entirely. It is also possible that only some elements of components of the sensor, such as lenses, detectors, emitters or mirrors are moveable. It is even possible that the radiation bundle directed towards the object is moveable while other optical components remain stationary. In general it can be concluded that the sensor SE defines a measurement location at the object OB. The sensor SE is configured such that the measurement location at the object is moveable. For the sake of clarity the term "sensor" is used to indicate the component or components which determine the measurement location.

Figure 4:
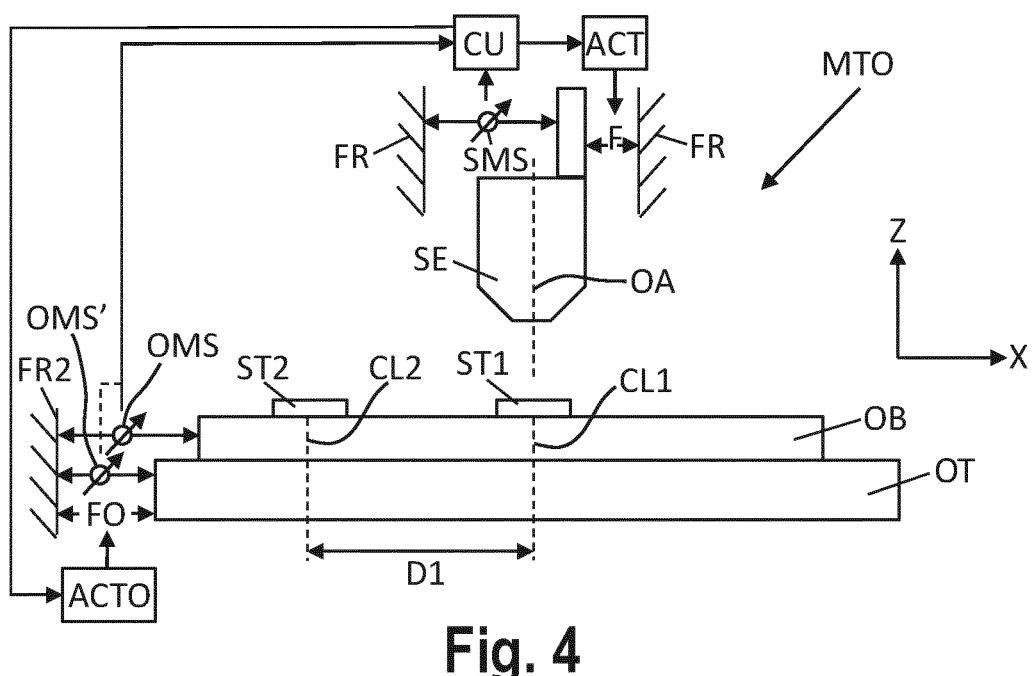
FIG. 4 schematically depicts a metrology apparatus according to an embodiment of the invention with the sensor over a first target, FIG. 5 schematically depicts the metrology apparatus of FIG. 4 during a method to position the sensor over a second target, FIG. 6 schematically depicts the metrology apparatus of FIG. 4 with the sensor being positioned over the second target, FIG. 7 schematically depicts the metrology apparatus of FIG. 4 with the sensor and the second target being positioned in a desired position, FIG. 8 schematically depicts an embodiment of a control diagram suitable for the metrology apparatus of FIG. 4, FIG. 9 schematically depicts another embodiment of a control diagram suitable for the metrology apparatus of FIG. 4, FIG. 10 schematically depicts the metrology apparatus of FIG. 4 with the sensor being positioned over a first target at another location within the available moving range compared to FIG. 4, FIG. 11 schematically depicts the metrology apparatus of FIG. 4 during another method to position the sensor over a second target, and FIG. 12 schematically depicts the metrology apparatus of FIG. 4 with the sensor and the second target being positioned in a desired position different from FIG. 7.

The metrology apparatus MTO further comprises a moveable object table OT, which for simplicity reasons is only depicted in FIG. 4 and omitted from the other drawings. The object table OT is configured to hold an object OB with a first target ST1 and a target ST2 although in practice more than two targets may be provided on the object OB. The object table OT may for instance be or be similar to a substrate table WT constructed to hold a substrate W as depicted in FIGS. 1 and 2.

In an embodiment, the metrology apparatus MTO is integrated into a lithographic system, which comprises the lithographic apparatus LA of FIG. 1 with the first and targets ST1, ST2 being alignment marks part of an exposed pattern allowing the metrology apparatus to determine a position of the exposed pattern of a substrate W and to align a subsequent pattern relative to a previously exposed pattern.

However, the first and second targets ST1, ST2 may alternatively be overlay marks with the metrology apparatus MTO being a separate tool that is part of or external to the lithographic system and that is used to measure an overlay or overlay distribution by measuring a position of the first and second targets ST1, ST2.

The first and second targets ST1, ST2 define a respective associated center line CL1, CL2, which is representative for an actual momentary position of the respective target ST1, ST2.

The sensor SE defines an optical axis OA representative for an actual momentary position of the sensor SE. The sensor SE may include light emitters (not shown) to emit or direct light towards a target (e.g. the first target ST1 or the second target ST2) and/or detectors (not shown) to detect radiation reflected by, scattered from, or emitted by a target.

The metrology apparatus MTO further includes a positioning system of which the main components are only depicted in FIG. 4 and omitted in the other drawings for simplicity reasons.

The positioning system comprises a sensor actuation system including an actuator ACT for applying a force F between the sensor SE and a frame FR in order to move and position the sensor SE and thus the optical axis OA in X-direction. The exemplary embodiment of FIGS. 4-7 only shows a one-dimensional case with only movement in X-direction. However, the invention can readily be extended to movement in other directions as well. To measure a momentary position of the sensor SE relative to the frame FR in X-direction, a sensor measurement system SMS is provided, including for instance an interferometer, an encoder or other suitable position sensor. It is also envisaged that the sensor SE itself is able to provide information about a relative position of the sensor SE relative to the object OB or the object table OT allowing to determine a position of the sensor SE in X-direction. In this case, the sensor SE comprises an integrated sensor measurement system SMS. It is further envisaged that the sensor measurement system SMS is configured to measure a momentary position of the sensor SE relative to a reference that may not be part of the frame FR, but is part of a separate measurement frame allowing to provide vibration isolation between the frame FR and the measurement frame and thus reduce disturbances caused by the reaction forces acting on the frame FR. The frame FR may also include a balance mass, an example of which can be shown in FIG. 2.

The frame portions FR shown in FIGS. 4-7 further indicate a possible moving range for the sensor SE in X-direction.

The positioning system further comprises an object actuation system including an actuator ACTO for applying a force FO between the object table OT and a frame FR2 in order to move and position the object table OT and thus the object OB in the X-direction, and an object measurement system OMS for measuring a momentary position of the object OB relative to the frame FR2 in the X-direction. Additionally, or alternatively, the object measurement system OMS may include a measurement system OMS' for measuring a momentary position of the object table OT relative to the frame FR2 to measure the position of the object OB indirectly. It is further envisaged that the object measurement system OMS and/or the measurement system OMS' are configured to measure a momentary position of respectively, the object OB or the object table OT relative to a reference that may not be part of the frame FR2, but is part of a measurement frame allowing to provide vibration isolation between the frame FR2 and the measurement frame. It is also envisaged that the object measurement system OMS or OMS'measure a momentary position of respectively the object OB or the object table OT relative to the frame FR.

The frame FR associated with the sensor and the frame FR2 associated with the object may be separate frames, frames that are connected to each other or may be frame portions of a single frame. The measurement frame mentioned in relation to the sensor and the measurement frame mentioned in relation to the object may be connected to each other or may be frame portions of a single frame.

The positioning system also comprises a control unit CU connected to the actutator ACT of the sensor actuation system, the sensor measurement system SMS, the actuator ACTO of the object actuation system, and the object measurement system OMS and/or the measurement system OMS'. The control unit CU is configured for driving the object actuation system based on an output of the object measurement system OMS and a desired momentary position of a target on the object as will be explained below in more detail. The control unit CU is further configured for driving the sensor actuation system based on an output of the sensor measurement system SMS and a desired momentary position of the sensor SE as will be explained below in more detail.

FIG. 4 depicts the situation in which the first target ST1 is at a desired position for performing a measurement with the sensor SE that is positioned over the first target ST1. In this situation, the optical axis OA is substantially aligned with the center line CL1, and preferably at a center of the available moving range. After measuring a parameter from the first target ST1, the sensor SE needs to be positioned over the next target to perform a subsequent measurement. In this exemplary measurement, the next target to be measured is the second target ST2, which is initially at a distance D1 from the sensor SE.

The control unit CU will thus drive the object actuation system, in this case the actuator ACTO, to move the second target ST2 to a desired position, which desired position is the position of the first target ST1 in FIG. 4. The desired momentary position of the target ST2 is thus set or a profile for the desired momentary position of the second target ST2 is eventually set to this desired position allowing the control unit CU to properly drive the object actuation system causing the second target ST2 to move to the right as shown in FIG. 5.

During this movement of the second target ST2, this can be at the beginning of the movement or near the end of the movement or any time in between, the control unit CU drives the sensor actuation system, in this case the actuator ACT, to move the sensor SE in a direction towards the second target ST2, i.e. a measured momentary position of the second target ST2 as that is the position the control unit CU expects the second target ST2 to be based on an output of the object measurement system OMS and/or the measurement system OMS'. When the sensor SE reaches a boundary of the moving range defined by the frame portions FR, the sensor SE is held at a waiting position until the second target ST2 gets in range of the sensor SE, i.e. until the second target ST2 moves below the sensor SE such that the sensor SE is over the second target ST2. The sensor SE is shown at this waiting position in FIG. 5. The waiting position may be at the edge of the moving range or at a predetermined distance from the edge of the moving range. An advantage of having the waiting position at the edge of the moving range is that the sensor SE and the second target ST2 will meet each other at the earliest time possible. An advantage of having the waiting position at a predetermine distance of the moving range is that the sensor SE is still able to move in both directions to for instance compensate for disturbances or moving errors.

Although the above example describes the sensor SE waiting at the waiting position until the target ST2 gets in range of the sensor SE, it is also envisaged that prior to the target ST2 getting in range of the sensor SE, the sensor SE is accelerated such that when the target ST2 gets in range of the sensor SE, the velocity of the sensor SE substantially matches the velocity of the target ST2. This may prevent undesirable high accelerations to the sensor SE or the target ST2 from passing the sensor SE requiring the sensor SE to catch up with the target ST2.

Figure 5:
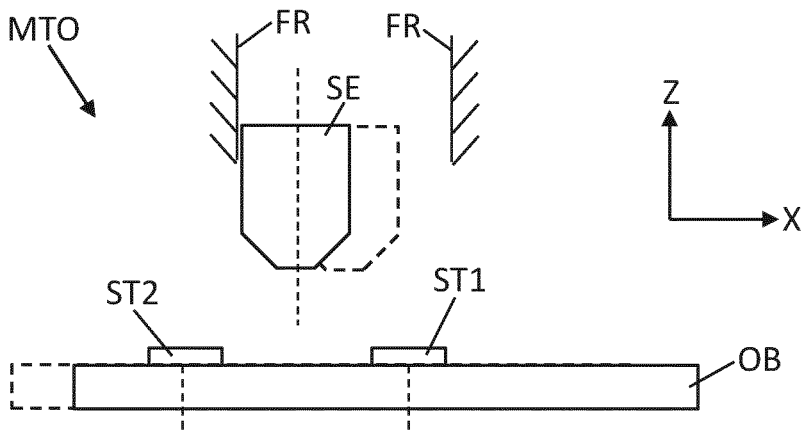
Figure 6:
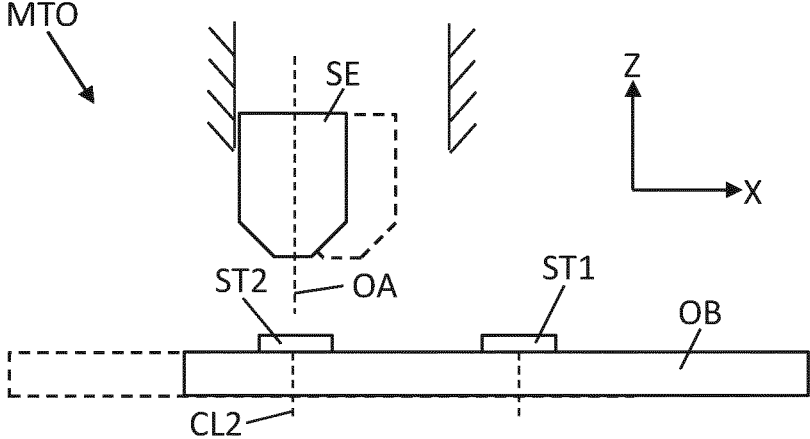
Figure 7:
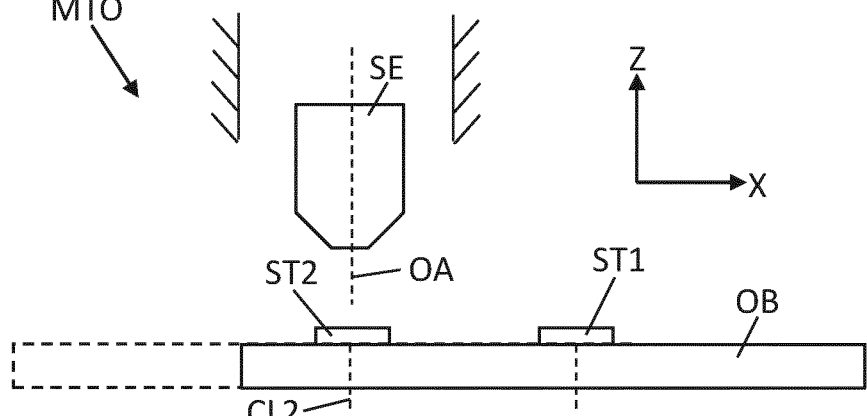

The position of the sensor SE and the object OB as shown in FIG. 4 is also shown in dashed lines in FIGS. 5-7 to indicate the relative movements made during the described method.

FIG. 6 depicts the situation that the sensor SE is at its waiting position and the second target ST2 has arrived at the same location allowing the sensor SE to "see" the second target ST2 and start performing measurements or other actions with respect to the second target ST2. It also marks the beginning of the sensor SE moving along with the second target ST2 towards the desired position as depicted in FIG. 7. As mentioned above, the sensor SE may start moving prior to moving along with the second target ST2 to smooth this synchronization process. In that case, the beginning of the sensor SE moving along with the second target ST2 does not start when the sensor is at its waiting position as depicted in FIG. 6.

An advantage over the prior art is that in between the situations depicted in FIGS. 6 and 7, the sensor SE can perform functions like focusing on the second target ST2, for instance by moving in Z-direction or by moving an optical portion thereof in Z-direction. Further, the movement between sensor SE and the second target ST2 can be synchronized so that the settling time between sensor SE and the second target ST2 after reaching the situation in FIG. 7 is reduced or even absent at all. Compared to prior art methods, the time between consecutive measurements of different targets can be reduced resulting in an improved throughput.

Although the sequence depicted in FIGS. 4-7 only shows a movement in X-direction, the same principle can be applied simultaneously in other directions as well.

Figure 8:
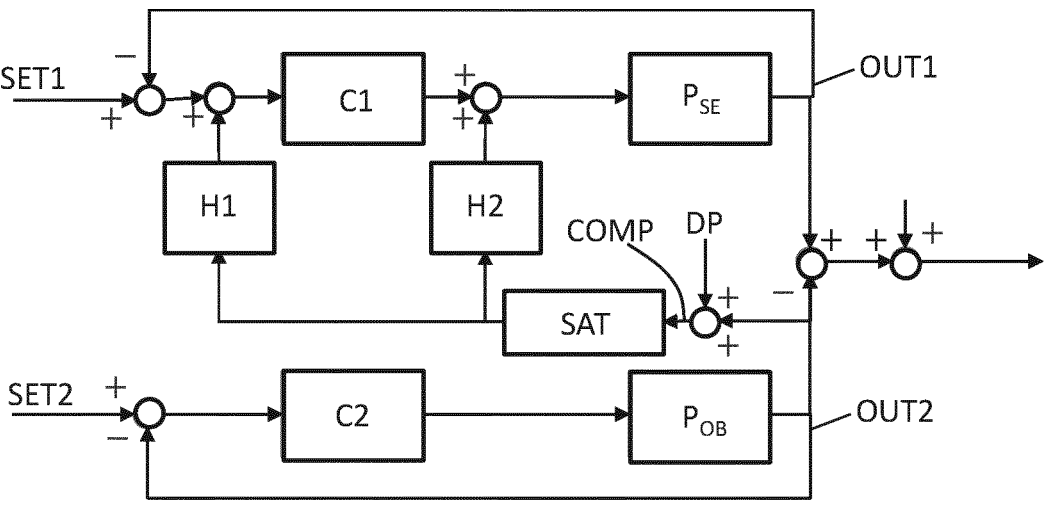

FIG. 8 depicts an embodiment of a control diagram suitable for the metrology apparatus MTO of FIG. 4. There is a first feedback loop for the sensor SE. The dynamical behavior of the sensor actuation system, the sensor SE, and the sensor measurement system SMS is represented by block $P_{SE}$. An output OUT1 of the block $P_{SE}$ is thus a measured momentary position of the sensor SE. This position is compared with a desired momentary position, i.e. a setpoint SET1, and the result is provided to a controller C1, which resides in control unit CU of FIG. 4 to drive the sensor actuation system.

The control diagram of FIG. 8 further comprises a second feedback loop for the object OB. The dynamical behavior of the object actuation system, the object OB and possibly object table OT, and the object measurement system OMS is represented by block $P_{OB}$. An output OUT2 of the block $P_{OB}$ is thus a measured momentary position of a target on the object OB. This position is compared with a desired momentary position, i.e. a setpoint SET2, and the result is provided to a controller C2, which resides in control unit CU of FIG. 4 to drive the object actuation system.

The output OUT2, and thus the measured momentary position of the target on the object OB is also compared to a desired position DP of the target for measuring, i.e. the desired end position, allowing the sensor SE to perform a measurement. The result of the comparison is indicated in FIG. 8 by reference symbol COMP and is representative for a distance still to be traveled by the target to reach the desired position DP. The COMP signal is fed through to the control loop of the sensor SE using a feedthrough controller having a first portion H1 that provides an offset value for the desired momentary position of the sensor SE and a second portion H2 that provides a feedforward drive signal for the sensor actuation system. This control scheme in FIG. 8 will urge the sensor SE towards the target. When the moving range of the sensor SE is insufficient to reach the target, a saturation block SAT will saturate, preferably smoothly, the COMP signal when its value is larger than the allowable moving range of the sensor SE, effectively positioning the sensor in the waiting position without the sensor actuation system trying to move the sensor SE out of its moving range. When the target reaches the moving range of the sensor SE, the COMP signal value will drop below the saturation value of the SAT block and the feedthrough controller H1, H2 will ensure that the sensor SE moves along with the target. As the measured momentary position of the target is fed to the feedthrough controller H1, H2, any deviations between OUT2 and SET2 are not adversely affecting the synchronization between sensor SE and target.

Figure 9:
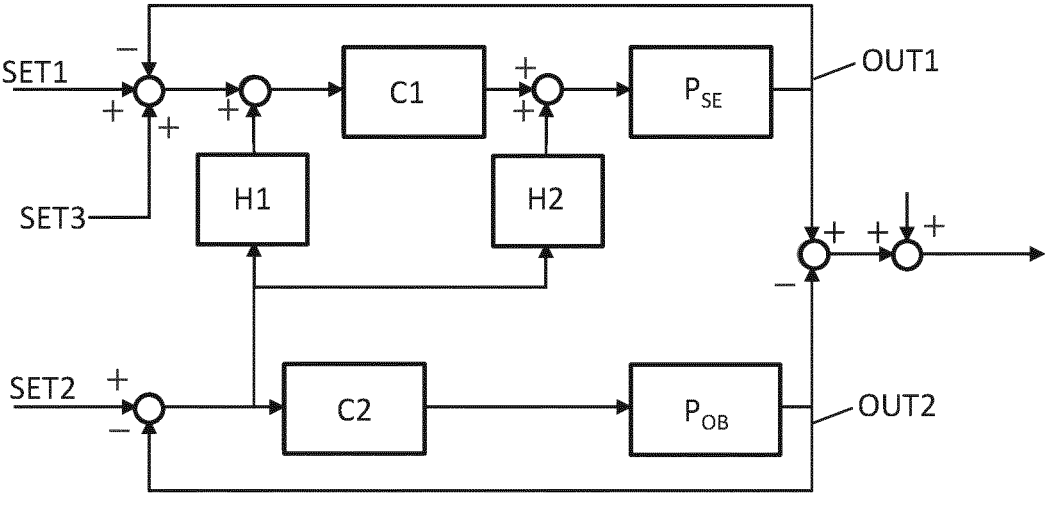

FIG. 9 depicts another embodiment of a control diagram suitable for the metrology apparatus MTO of FIG. 4. The first and second feedback loop for the sensor SE and the object OB are similar to the embodiment of FIG. 8. A difference with the embodiment of FIG. 8 is that in the embodiment of FIG. 9, a comparison between the measured momentary position of the object OB and the desired momentary position of the object OB, i.e. the position error of the object OB is fed to the control loop of the sensor SE via a feedthrough controller having a first portion H1 that provides an offset value for the desired momentary position of the sensor SE and a second portion H2 that provides a feedforward drive signal for the sensor actuation system. In this way, the feedthrough controller H1, H2 ensures that a position of the sensor SE will be adjusted based on position errors of the object OB resulting in synchronized movement of the sensor SE and the object OB. How and when the sensor SE must move towards the target according to the invention is then dictated by an additional setpoint SET3 that is added to the initial desired momentary position SET1 of the sensor SE. The SET3 value is a function of the desired momentary position of the target and the desired end position of the target, preferably including some reserved range for allowing to compensate for position errors of the object OB and taking into account the available moving range of the sensor SE.

An advantage of the control diagram of FIG. 9 is that it makes full use of the available moving range and the sensor will automatically move towards the target when this target is up for measuring and needs to be moved to the sensor SE. An advantage of the control diagram of FIG. 9 is that the SET3 signal is easier to regulate, for instance to allow the sensor to move towards the target only when the target is approaching the available moving range of the sensor SE, thereby minimizing the time the sensor SE is at the waiting position.

Figures 10, 11:
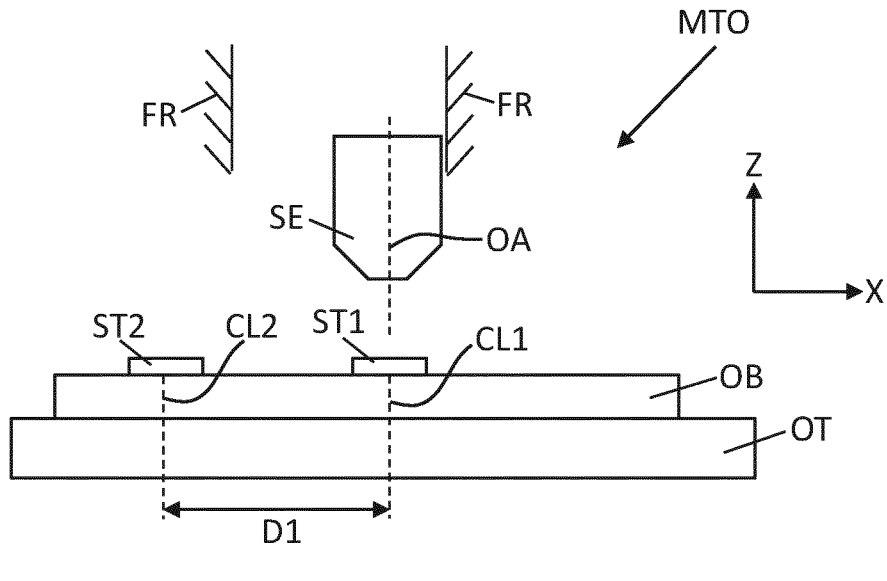

FIG. 10 schematically depicts the metrology apparatus MTO of FIG. 4. A difference between FIG. 4 and FIG. 10 is that some components described in relation to FIG. 4 are omitted from FIG. 10 for simplicity reasons. Another difference is that in FIG. 4, the sensor SE is positioned in a center of the available moving range defined by the frame portions FR, while in FIG. 10, the sensor SE is at or near an edge of the available moving range. In both situations, the sensor SE is positioned over the first target ST1. It is assumed that a measurement in relation to the first target ST1 has been finished and the metrology apparatus MTO is ready to perform a measurement in relation to the second target ST2.

Figure 12:
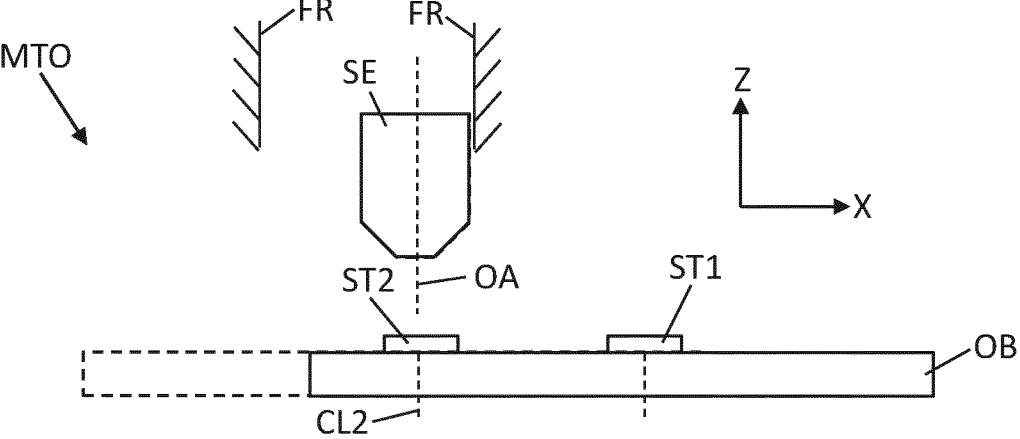

Hence, as described above, the object OB will be moved towards the right so that the second target ST2 moves towards the sensor SE. During this movement, the sensor SE itself is moved to the left towards the second target ST2. The situation in which the sensor SE and the second target ST2 meet each other is depicted in FIG. 11. This meeting position is at or near the opposite edge of the available moving range allowing to use substantially the entire moving range instead of substantially half the available moving range as shown in relation to FIGS. 4-7 and thus extending the time period that the sensor SE is over the second target ST2 before reaching the desired position as depicted in FIG. 12. The larger time period provides more time for settling, e.g. focus and/or position if needed and thus further improves the throughput.

The invention is based on the insight that settling, e.g. focus and/or position, may at least partially occur during movement of the object. However, when settling is within predetermined limits before the movement of the object OB has finished, it is envisaged that a measurement using the sensor SE is already started and possibly finished before movement of the object has finished, i.e. before the desired position has been reached, thereby further improving the throughput. It is even possible that the desired position is determined by the end of the settling process or by the end of the measurement, so that minimal time is wasted.

Although not shown in FIGS. 10-12, the available moving range may be used in different ways depending on specific demands. In one embodiment, the sensor SE and second target ST2 move with a substantially constant velocity between the situations as depicted in FIGS. 11 and 12, possibly with the sensor SE and second target ST2 being held in the desired position depicted in FIG. 12 when the measurement has not been finished when arriving at said desired position. In another embodiment, the sensor SE and target ST2 are initially moved to an intermediate position, e.g. the center position of the available moving range to perform the measurement, and moved to the desired position as depicted in FIG. 12 just before the measurement ended. This may have the advantage that the measurement is carried out for a significant amount of time at the center position which may be a position in which the sensor actuation system dissipates the least energy, which may be advantageous from a thermal point of view. In a further embodiment, the sensor SE and target ST2 may initially be moved to the position of FIG. 12, then moved to an intermediate position, e.g. the center position of the available moving range to perform the measurement, and subsequently moved back to the desired position as depicted in FIG. 12 just before the measurement ended. Besides the minimal dissipation advantage mentioned above for the previous embodiment, this embodiment may have the advantage that the accelerations to slow down the object OB may be less compared to the situation of the previous embodiment when the object has to be stopped at the center position right away. Other moving strategies may also be envisaged.

Further embodiments are disclosed in the subsequent numbered clauses:

1. A method for positioning a sensor over a target on a moveable object, comprising the following steps:
   a. moving the object to move the target to a desired position,
   b. moving the sensor in a direction towards a measured momentary position of the target,
   c. when the sensor is over the target, moving the sensor along with the target to the desired position of the target.
2. A method according to clause 1, wherein the sensor defines a measurement location at the object.
3. A method according to clause 1 or 2, wherein step b. is carried out by moving the sensor to a desired waiting position determined by the measured momentary position of the target and an available moving range of the sensor.
4. A method according to any of clauses 1 to 3, wherein the sensor is an optical sensor, and wherein the method further includes the step of focusing the sensor on the target which is initiated during step c. before the target reaches the desired position.
5. A method according to any of clauses 1 to 4, wherein during step c. movement of the sensor is controlled based on a measured momentary position of the target to synchronize the movement of the sensor with the movement of the target.
6. A method according to clause 3, wherein the waiting position is at an edge of the available moving range.
7. A method according to clause 3, wherein the waiting position is at a predetermined distance to an edge of the available moving range.
8. A method according to any of clauses 1 to 7, wherein the sensor is accelerated to match a velocity of the target prior to step c.
9. A method according to any of clauses 1 to 8, wherein a measurement of a parameter of the target with the sensor is at least partially carried out during step c.
10. A method according to clause 6 or 7, wherein the desired position of the target is at an intermediate, e.g. center, position of the available moving range.
11. A method according to clause 6 or 7, wherein the desired position of the target is at or near an opposite edge of the available moving range.
12. A positioning system for positioning a sensor over a target on a moveable object, comprising:
   an object actuation system for moving and positioning the moveable object,
   a sensor actuation system for moving and positioning the sensor,
   an object measurement system for measuring a momentary position of the moveable object,
   a sensor measurement system for measuring a momentary position of the sensor,
   a control unit for driving the object actuation system based on an output of the object measurement system and a desired momentary position of the target on the object, and for driving the sensor actuation system based on an output of the sensor measurement system and a desired momentary position of the sensor,
   wherein the control unit is configured to:

a. drive the object measurement system to move the target to a desired position, b. drive the sensor actuation system to move the sensor in a direction towards the measurement momentary position of the target, c. when the sensor is over the target, drive the sensor actuation system to move the sensor along with the target to the desired position of the target.

13. A positioning system according to clause 12, wherein the control unit is configured to drive the sensor actuation system based on the output of the sensor measurement system, the desired momentary position of the sensor and the measured momentary position of the moveable object.

14. A positioning system according to clause 12 or 13, wherein the sensor is an optical sensor, and wherein the control unit is configured to start focusing the sensor on the target during driving of the sensor actuation system to move the sensor along with the target to the desired position of the target.

15. A lithographic apparatus comprising a positioning system according to any of clauses 10-12.

16. A lithographic apparatus according to clause 15, further comprising:

an illumination system configured to condition a radiation beam;

a support constructed to support a patterning device, the patterning device being capable of imparting the radiation with a pattern in its cross-section to form a patterned radiation beam;

a substrate table constructed to hold a substrate; and a projection system configured to project the patterned radiation beam onto a target portion of the substrate, wherein the moveable object is a substrate.

17. A metrology apparatus comprising:

a moveable sensor, a moveable object table to hold an object with a target, and a positioning system according to any of clauses 12 to 14, wherein the object actuation system is configured to move and position the object by moving and positioning the object table.

18. A device manufacturing method wherein use is made of a lithographic apparatus according to clause 15 or 16.

Although the entire specification describes the sensor SE to be moveable, which suggests that the entire sensor including emitters, detectors, optical components, etc. is moveable, this is not necessarily the case. It is also possible that only some components, such as lenses, detectors, emitters or mirrors are moveable. It is even possible that the radiation bundle directed towards the object is moveable while other optical components remain stationary. In general it can be concluded that the sensor SE defines a measurement location at the object. The sensor SE is configured such that the measurement location at the object is moveable. This can be done in many different ways and is not the subject of this invention.

Although the entire specification described the sensor SE to be an optical sensor, the sensor may be an electron beam sensor, for receiving electron beam radiation from a target.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method for positioning a sensor over a target on a moveable object, comprising:

moving the object to move the target to a desired position; and moving the sensor in a direction towards a measured momentary position of the target and to a desired waiting position determined by the measured momentary position of the target and an available moving range of the sensor;

wherein when the sensor is over the target, moving the sensor along with the target to the desired position of the target.

2. The method of claim 1, wherein the sensor defines a measurement location at the object.

3. The method of claim 1, wherein:

the sensor is an optical sensor, and the method further includes focusing the optical sensor on the target that is initiated during the moving of the optical sensor along with the target is performed before the target reaches the desired position.

4. The method of claim 1, wherein during the moving of the sensor when moved along with the target is controlled based on a measured momentary position of the target to synchronize the movement of the sensor with the movement of the target.

5. The method of claim 1, wherein the sensor is accelerated to match a velocity of the target prior to the moving of the sensor along with the target.

6. The method of claim 1, wherein a measurement of a parameter of the target with the sensor is at least partially carried out during the moving of the sensor along with the target.

7. The method of claim 1, wherein the waiting position is at an edge of the available moving range.

8. The method of claim 7, wherein the desired position of the target is at an intermediate or center position of the available moving range.

9. The method of claim 7, wherein the desired position of the target is at or near an opposite edge of the available moving range.

10. The method of claim 1, wherein the waiting position is at a predetermined distance to an edge of the available moving range.

11. A positioning system for positioning a sensor over a target on a moveable object, comprising:

an object actuation system configured to move and position the moveable object;

a sensor actuation system configured to move and position the sensor;

an object measurement system configured to measure a momentary position of the moveable object;

a sensor measurement system configured to measure a momentary position of the sensor; and a control unit configured to:

drive the object actuation system based on an output of the object measurement system and a desired momentary position of the target on the object, drive the sensor actuation system based on an output of the sensor measurement system and a desired momentary position of the sensor, drive the object measurement system to move the target to a desired position, and drive the sensor actuation system to move the sensor in a direction towards the measurement momentary position of the target and to a desired waiting position determined by the measured momentary position of the target and an available moving range of the sensor, and wherein when the sensor is over the target, the control unit is configured to drive the sensor actuation system to move the sensor along with the target to the desired position of the target.

12. The positioning system of claim 11, wherein the control unit is configured to drive the sensor actuation system based on the output of the sensor measurement system, the desired momentary position of the sensor and the measured momentary position of the moveable object.

13. The positioning system of claim 11, wherein:

the sensor is an optical sensor, and the control unit is configured to start focusing the optical sensor on the target during driving of the optical sensor actuation system to move the optical sensor along with the target to the desired position of the target.

14. A metrology apparatus comprising:

a moveable sensor;

a moveable object table to hold an object with a target; and a positioning system of claim 11, wherein the object actuation system is configured to move and position the object by moving and positioning the object table.

15. The positioning system of claim 11, wherein the waiting position is at an edge of the available moving range.

16. The positioning system of claim 11, wherein the waiting position is at a predetermined distance to an edge of the available moving range.

17. The positioning system of claim 11, wherein the desired position of the target is at an intermediate or center position of the available moving range.

18. The positioning system of claim 11, wherein the desired position of the target is at or near an opposite edge of the available moving range.

* * * * *